(12) United States Patent
Tseng et al.

(10) Patent No.: US 6,333,262 B1
(45) Date of Patent: Dec. 25, 2001

(54) METHOD FOR FORMING SILICIDE

(75) Inventors: Kuen-Syh Tseng, Ping-Tung; Ruoh-Haw Chang, Po-Tzu; Shu-Jen Chen, Hsin-Chu, all of (TW)

(73) Assignee: United Microelectronics Corp., Hsin-Chu (TW)

( * ) Notice: Subject to any disclaimer, the term of this patent is extended or adjusted under 35 U.S.C. 154(b) by 0 days.

(21) Appl. No.: 09/636,558

(22) Filed: Aug. 11, 2000

(51) Int. Cl.$^7$ ........................................... H01L 20/44
(52) U.S. Cl. .................. 438/664; 438/197; 438/299; 438/655; 437/174; 437/195; 437/200
(58) Field of Search ........................ 438/664, 655, 438/197, 299; 437/174, 195, 200

(56) References Cited

U.S. PATENT DOCUMENTS

| | | | |
|---|---|---|---|
| 4,729,969 | * 3/1988 | Suda et al. | 437/200 |
| 5,236,865 | * 8/1993 | Sandhu et al. | 437/174 |
| 5,543,359 | * 8/1996 | Horiuchi | 437/195 |
| 5,851,921 | * 12/1998 | Gardner et al. | 438/655 |
| 6,187,617 | * 2/2001 | Gauthier, Jr. et al. | 438/197 |
| 6,204,132 | * 3/2001 | Kittl et al. | 438/299 |

* cited by examiner

*Primary Examiner*—Richard Elms
*Assistant Examiner*—Pho Luu
(74) *Attorney, Agent, or Firm*—Winston Hsu

(57) ABSTRACT

A method for forming silicide on a semiconductor wafer. The semiconductor wafer includes a doped silicon layer on a predetermined area of the semiconductor wafer, a metal layer positioned on the doped silicon layer, and a barrier layer covering the metal layer. A first rapid thermal processing (RTP) step is performed to make portions of the metal layer react with silicon inside the doped silicon layer so as to form a transitional silicide. The barrier layer and the portions of the metal layer that have not reacted with silicon are then removed. A dielectric layer is formed on the transitional silicide. Finally, a second rapid thermal processing (RTP) step is performed to make the transitional silicide react with portions of the doped silicon layer so as to form the silicide.

13 Claims, 3 Drawing Sheets

METHOD FOR FORMING SILICIDE

BACKGROUND OF THE INVENTION

1. Field of the Invention

The present invention relates to a method for forming silicide on a semiconductor wafer, and more particularly, to a method for forming silicide while simultaneously preventing impurities in a doped silicon layer from outgassing during rapid thermal processing steps.

2. Description of the Prior Art

Metal-oxide-semiconductor (MOS) transistors are important components of semiconductor circuits, and the electrical performance of the gate in the MOS transistor is an important issue that effects the quality of MOS transistors. The prior art gate typically includes a doped polysilicon layer or a doped amorphous silicon layer used as the main conductive layer, and a silicide layer stacked on the conductive layer. The silicide layer provides a good ohmic contact to the devices of the MOS transistor, thus reducing sheet resistance and enhancing the operational speed of the MOS transistor.

Please refer to FIG. 1 to FIG. 3. FIG. 1 to FIG. 3 are schematic diagrams of the method for forming silicide 28 on a semiconductor wafer 10 according to the prior art. As shown in FIG. 1, the semiconductor wafer 10 includes a substrate 12. The substrate 12 shown in FIG. 1 is used to form a MOS transistor, and the silicide 28 is a portion of the gate electrode of the MOS transistor. The substrate 12 includes a gate oxide 14, a doped polysilicon layer 16 stacked on the gate oxide 14, and two spacers 18 formed adjacent to the gate 17. In the prior art method, a thin film deposition process is performed to form a cobalt layer 22 on the substrate 12 and the gate 17. A titanium nitride (TiN) layer 24 is then deposited on the cobalt layer 22 using a sputtering method.

As shown in FIG. 2, a rapid thermal processing (RTP) step is performed, the process temperature between 720° C. and 760° C., to make portions of the cobalt layer 22 react with silicon inside the doped polysilicon layer 16 and inside the silicon substrate 12 around the gate 17 so as to form a transitional silicide 26. The transitional silicide is a cobalt-rich silicide, such as CoSi or $Co_2Si$. The titanium nitride layer 24 and the portions of the cobalt layer 22 that have not reacted with the silicon are then removed.

Another rapid thermal processing step is then performed, the process temperature between 830° C. and 870° C., to make the transitional silicide 26 react with portions of the doped silicon layer 16 and the silicon substrate 12 so as to form the cobalt silicide ($CoSi_2$) 28 that is much more stable and which has a low resistance. Finally, a chemical vapor deposition (CVD) process is performed to form a dielectric layer 29 of silicon dioxide, which covers the gate 17, as shown in FIG. 3.

Because there is no barrier layer or passivation layer covering the transitional silicide 26 during the second rapid thermal processing step, impurities, such as arsenic or phosphorus, in the doped polysilicon layer 16 will outgass during the rapid thermal processing step. This results in an impurity dosage in the doped polysilicon layer 16 that is less than the predetermined dosage, and affects the conductive capability and electrical performance of the gate electrode. In addition, a portion of the impurities outgassing from the doped polysilicon layer adhere to the surface of the chamber of the rapid thermal processing machine, which can contaminate or even harm the machine.

SUMMARY OF THE INVENTION

It is therefore a primary objective of the present invention to provide a method for forming silicide on a semiconductor wafer so as to solve the above mentioned problems.

In the preferred embodiment of the present invention, the semiconductor wafer includes a doped silicon layer on a predetermined area of the semiconductor wafer, a cobalt (Co) layer positioned on the doped silicon layer, and a titanium nitride (TiN) layer covering the cobalt layer. A first rapid thermal processing (RTP) step is first performed to make portions of the metal layer react with silicon inside the doped silicon layer so as to form a transitional silicide, CoSi or $Co_2Si$. The titanium nitride layer and the portions of the cobalt layer that have not reacted with the silicon are then removed. A dielectric layer is formed on the transitional silicide. Finally, a second rapid thermal processing (RTP) step is performed to make the transitional silicide react with portions of the doped silicon layer so as to form the silicide.

In another embodiment of the present invention, a first rapid thermal processing (RTP) step is initially performed to make portions of the metal layer react with silicon inside the doped silicon layer so as to form a transitional silicide, CoSi or $Co_2Si$. The titanium nitride layer and the portions of the cobalt layer that have not reacted with the silicon are then removed. A barrier layer of an optional material is formed on the transitional silicide. A second rapid thermal processing (RTP) step is performed to make the transitional silicide react with portions of the doped silicon layer so as to form the cobalt silicide ($CoSi_2$). Finally, the barrier layer is removed, and a dielectric layer is formed on the surface of the cobalt silicide.

The dielectric layer or the barrier layer is deposited on the transitional silicide before the second rapid thermal processing step in the present invention to prevent the impurities in the doped polysilicon layer from outgassing during the rapid thermal processing step. Therefore, the conductive capability and electrical performance of the gate electrode is ensured.

These and other objectives of the present invention will no doubt become obvious to those of ordinary skill in the art after reading the following detailed description of the preferred embodiment, which is illustrated in the various figures and drawings.

DETAILED DESCRIPTION OF THE PREFERRED EMBODIMENT

Figure 1:
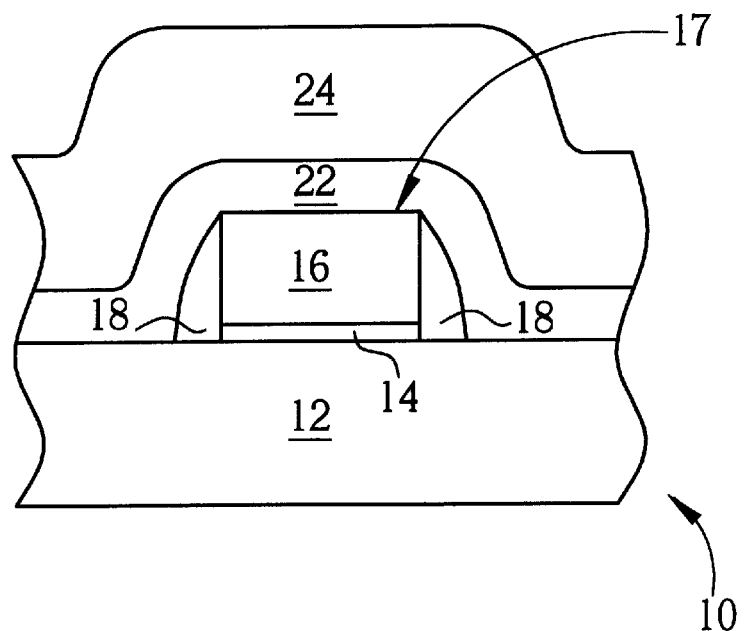
FIG. 1 to FIG. 3 are schematic diagrams of the method for forming silicide on a semiconductor wafer according to the prior art.
Figure 2:
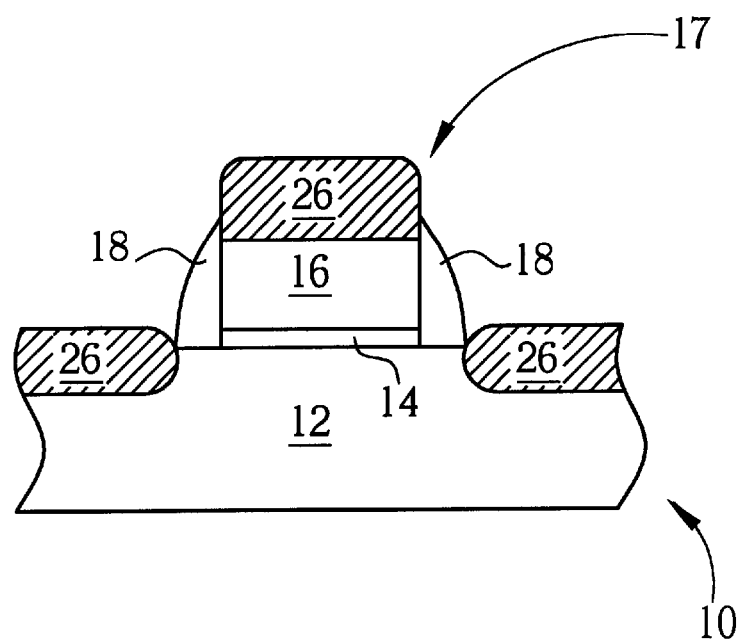
Figure 3:
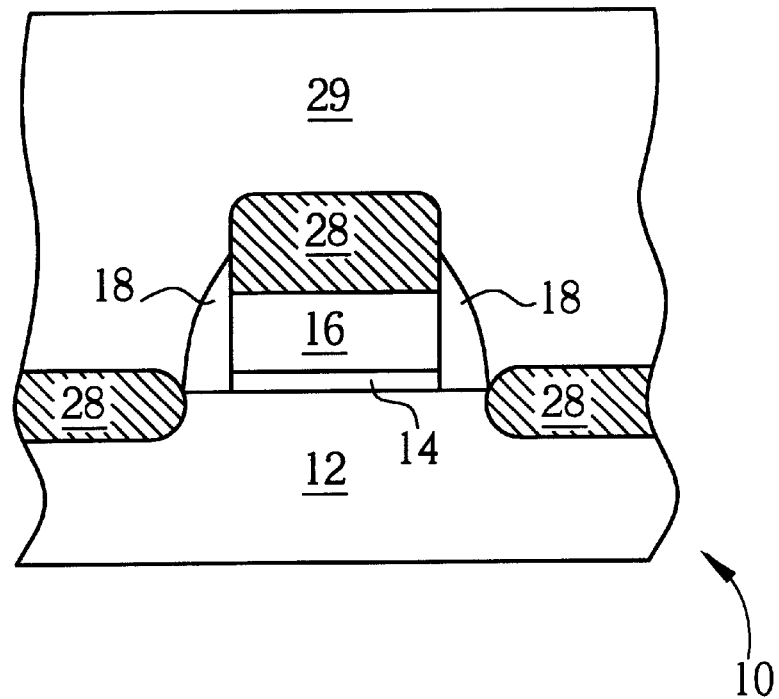
Figure 4:
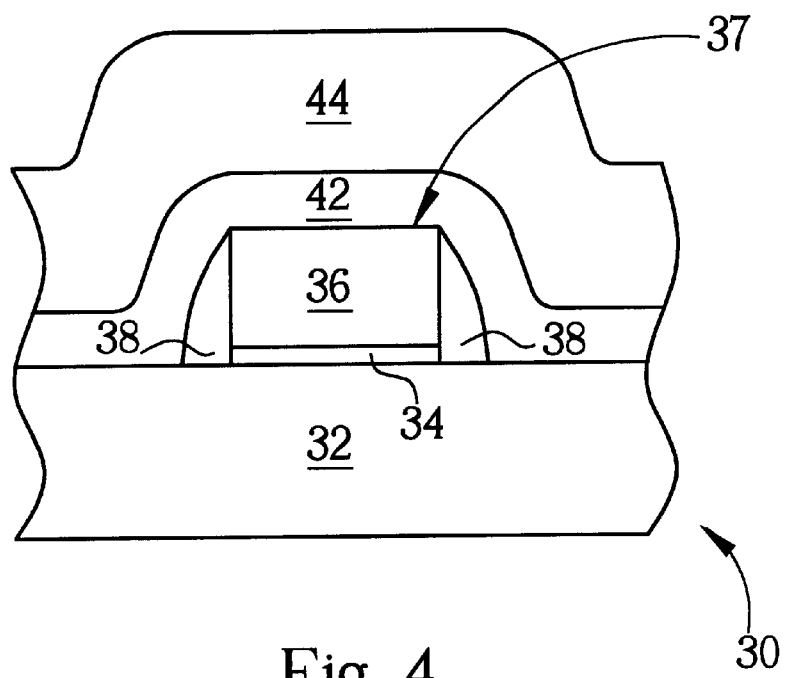
FIG. 4 to FIG. 6 are schematic diagrams of the method for forming silicide on a semiconductor wafer according to the present invention.
Figure 5:
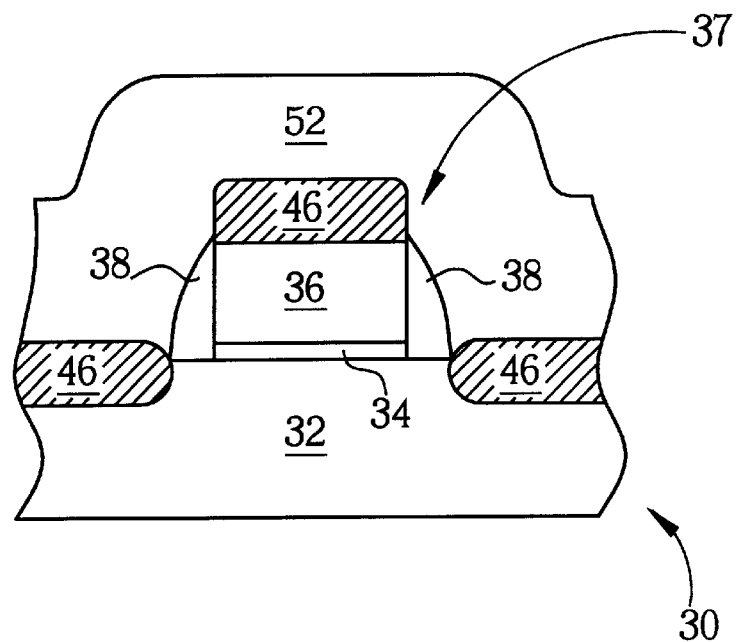
Figure 6:
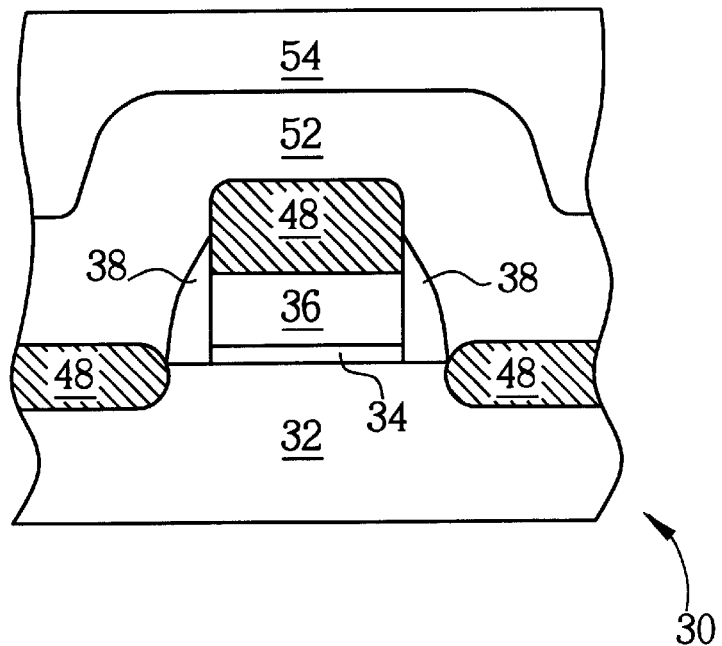

Please refer to FIG. 4 to FIG. 6. FIG. 4 to FIG. 6 are schematic diagrams of the method for forming silicide 48 on a semiconductor wafer 30 according to the present invention. As shown in FIG. 4, the semiconductor wafer 30 includes a substrate 32. The substrate 32 is used to form a MOS transistor, and the silicide 48 is a portion of the gate electrode of the MOS transistor.

The substrate 32 includes a gate oxide 34, a doped polysilicon layer 36 stacked on the gate oxide 34, and two spacers 38 formed adjacent to the gate 37. The doped polysilicon layer 36 is doped with arsenic (As), which reduces the resistance of the doped polysilicon layer 36. The spacers 38, formed of silicon nitride, are used as a mask during the formation of lightly doped drains (LDD), and the source/drains (S/D), and are further used to prevent silicide from forming on the walls of the gate 37.

In the present invention method, a thin film deposition process is performed using a sputtering method to form a cobalt layer 42 on the substrate 32 and the gate 37. A reactive deposition process is used to deposit a titanium nitride (TiN) layer 44 on the cobalt layer 42. The titanium nitride layer 44 is used as a barrier layer in the process of forming self-aligned silicide (salicide), making the cobalt layer 42 react more evenly with the doped polysilicon layer 42 or the silicon substrate 32.

As shown in FIG. 5, a rapid thermal processing step is performed with a process temperature between 720° C. and 760° C. to make portions of the cobalt layer 42 react with silicon inside the doped polysilicon layer 36, and react with the silicon inside the silicon substrate 32 around the gate 37 so as to form a transitional silicide 46. The transitional suicide 46 is a cobalt-rich suicide, such a s CoSi or $Co_2Si$. Cobalt-rich silicide is a kind of silicide that is very un stable and which has a high electrical resistance.

The silicide 48 on the gate 37 is used as the gate electrode, and the silicide 48 on the substrate 32 adjacent to the gate 37 is used to electrically connect to the source/drain (not shown) of the MOS transistor. Hence, an additional thermal processing step is required to transform the transitional silicide 46 into silicide 48 that is both stable and with a low electrical resistance.

A chemical vapor deposition (CVD) process is performed to form a dielectric layer 52 of silicon dioxide on the semiconductor wafer 30. Another rapid thermal processing step is the n performed with a process temperature between 830° C. and 870° C. to make the transitional silicide 46 react with portions of the doped silicon layer 36 and the silicon substrate 32 so as to form the cobalt silicide ($CoSi_2$) 48 that is much stable and which has a low resistance, as shown in FIG. 6. Finally, another dielectric layer 54 can be formed using a CVD method to cover the dielectric layer 52 so that the total thickness of the dielectric layer attains electrical demands. Alternatively, the dielectric layer 52 can be formed directly as thick as required.

The aforementioned method is the preferred embodiment of the present invention, the dielectric layer 52 covering the transitional silicide 46 before the second rapid thermal processing step. Thus, no additional process steps are added to the present invention method.

In another embodiment of the present invention, after removing the titanium nitride layer 44 and the portions of the cobalt layer 42 that have not reacted with silicon, a barrier layer is formed on the transitional silicide 46 to prevent arsenic impurities in the doped polysilicon layer 36 from outgassing during the second rapid thermal processing step, thus ensuring the conductive capability and electrical performance of the gate electrode. Because the barrier layer is stripped in subsequent processes, the barrier layer can be formed of any suitable material, and need not be limited to dielectric materials, such as titanium nitride, which is the most convenient material to use in the formation of silicide. A second rapid thermal processing (RTP) step is then performed to make the transitional silicide 46 react with portions of the doped polysilicon layer 36 so as to form cobalt silicide ($CoSi_2$) 48. Finally, the barrier layer is removed, and a dielectric layer is formed on the surface of the cobalt silicide 48.

Because the dielectric layer 52, or the barrier layer, is deposited on the transitional silicide 46 before the second rapid thermal processing step, there is a barrier covering the transitional silicide 46 to prevent the impurities in the doped polysilicon layer 36 from outgassing during the rapid thermal processing step. Therefore, the dosage of impurities in the doped polysilicon layer 36 is ensured to be the predetermined dosage, and the conductivity and electrical performance of the gate electrode are enhanced. Furthermore, in the preferred embodiment of the present invention, the dielectric layer 52 used as a barrier in the second rapid thermal processing step can be directly used as the dielectric layer that covers the gate 37 in subsequent processes. Hence, no additional steps are required for this method. In addition, the problem in the prior art of the outgassing of impurities from the doped polysilicon layer, which then adhere to the surface of the chamber of the rapid thermal processing machine, is simultaneously solved.

In contrast to the prior art method for forming silicide 28, the dielectric layer 52, or the barrier layer, is deposited on the transitional silicide 46 before the second rapid thermal processing step in the present invention so as to prevent the impurities in the doped polysilicon layer 36 from outgassing during the rapid thermal processing step. Therefore, the conductive capability and electrical performance of the gate electrode are ensured.

Those skilled in the art will readily observe that numerous modifications and alterations of the device may be made while retaining the teachings of the invention. Accordingly, the above disclosure should be construed as limited only by the metes and bounds of the appended claims.

What is claimed is:

1. A method for forming silicide on a semiconductor wafer, the semiconductor wafer comprising a doped silicon layer on a predetermined area of the semiconductor wafer, a metal layer positioned on the doped silicon layer, and a barrier layer covering the metal layer, the method comprising:

performing a first rapid thermal processing (RTP) step to make portions of the metal layer react with silicon inside the doped silicon layer so as to form a transitional silicide;

removing the barrier layer and the portions of the metal layer that have not reacted with the silicon;

forming a dielectric layer on the transitional silicide; and performing a second rapid thermal processing (RTP) step to make the transitional silicide react with portions of the doped silicon layer so as to form the silicide.

2. The method of claim 1 wherein the barrier layer is a titanium nitride (TiN) layer.

3. The method of claim 1 wherein the dielectric layer is used to prevent impurities in the doped silicon layer from outgassing during the second rapid thermal processing step.

4. The method of claim 1 wherein the metal layer is a cobalt (Co) layer.

5. The method of claim 4 wherein the transitional silicide is a cobalt-rich silicide (CoSi or $Co_2Si$).

6. The method of claim 4 wherein the silicide is a cobalt silicide ($CoSi_2$).

7. The method of claim 1 wherein the process temperature of the first rapid thermal processing step is between 720° C. and 760° C., and the process temperature of the second rapid thermal processing step is between 830° C. and 870° C.

8. A method for forming silicide on a semiconductor wafer, the semiconductor wafer comprising a doped silicon layer on a predetermined area of the semiconductor wafer, a metal layer positioned on the doped silicon layer, and a first barrier layer covering the metal layer, the method comprising:

performing a first rapid thermal processing (RTP) step to make portions of the metal layer react with silicon inside the doped silicon layer so as to form a transitional silicide;

removing the first barrier layer and the portions of the metal layer that have not reacted with silicon;

forming a second barrier layer on the transitional silicide, wherein the second barrier layer is used to prevent impurities in the doped silicon layer from outgassing during a second rapid thermal processing step;

performing the second rapid thermal processing (RTP) step to make the transitional silicide react with portions of the doped silicon layer so as to form the silicide;

removing the second barrier layer; and forming a dielectric layer on the silicide.

9. The method of claim 8 wherein the first barrier layer and the second barrier layer are both formed of titanium nitride (TiN).

10. The method of claim 8 wherein the metal layer is a cobalt (Co) layer.

11. The method of claim 10 wherein the transitional silicide is a cobalt-rich silicide (CoSi or $Co_2Si$).

12. The method of claim 10 wherein the silicide is a cobalt silicide ($CoSi_2$).

13. The method of claim 8 wherein the process temperature of the first rapid thermal processing step is between 720° C. and 760° C., and the process temperature of the second rapid thermal processing step is between 830° C. and 870° C.

* * * * *